(12) United States Patent
Galbiati

(10) Patent No.: US 8,119,253 B2
(45) Date of Patent: Feb. 21, 2012

(54) CONTACTS ON DIAMOND

(75) Inventor: Arnaldo Galbiati, Bournemouth (GB)

(73) Assignee: Diamond Detectors Limited (GB)

(*) Notice: Subject to any disclaimer, the term of this patent is extended or adjusted under 35 U.S.C. 154(b) by 157 days.

(21) Appl. No.: 12/580,109

(22) Filed: Oct. 15, 2009

(65) Prior Publication Data
US 2010/0098970 A1 Apr. 22, 2010

(30) Foreign Application Priority Data
Oct. 16, 2008 (GB) .................................. 0819001.9

(51) Int. Cl.
*B32B 9/00* (2006.01)
*B32B 19/00* (2006.01)
*H01L 31/0312* (2006.01)
*C03C 27/00* (2006.01)
*G01T 3/00* (2006.01)
*G11B 11/105* (2006.01)
*G11B 5/64* (2006.01)

(52) U.S. Cl. ........ 428/689; 428/332; 428/336; 428/408; 428/634; 428/688; 257/77; 257/E21.005; 257/E21.049; 250/390.01

(58) Field of Classification Search .................. 428/408, 428/688, 689, 332, 336, 634; 257/77, E21.005, 257/E21.049; 250/390.01
See application file for complete search history.

(56) References Cited

FOREIGN PATENT DOCUMENTS

| | | |
|---|---|---|
| EP | 0 209 257 A1 | 1/1987 |
| EP | 0 406 882 A | 1/1991 |
| EP | 0 519 472 A | 12/1992 |
| JP | 52/18402 A | 8/1993 |
| JP | 2002/076008 A | 3/2002 |
| WO | 01/96633 A1 | 12/2001 |
| WO | 01/96634 A1 | 12/2001 |
| WO | 2008/090511 A1 | 7/2008 |

OTHER PUBLICATIONS

Kaneko et al., "Radiation Detector made of Diamond Single Crystal Grown by a Chemical Vapor Deposition Method", Nuclear Instruments and Methods in Physics Research A, vol. 505, 2003, pp. 187-190.*
Kashiwagi et al., "Investigation of Basic Characteristics of Synthetic Diamond Radiation Detectors", IEEE Transactions of Nuclear Science, vol. 53, No. 2, 2006, pp. 630-6635.*
Tachibana et al., "Correlation of the electrical properties of metal contacts on diamond films with the chemical nature of the metal-diamond interface. I. Gold Contacts: A non-carbide-forming metal", Phys. Rev. B, vol. 45, 1992, pp. 11968-11974.*
Cong et al., "Characterization of ion beam induced modification of diamond films by real time spectroscopic ellipsometry", Journal of Vacuum Science & Technology A, vol. 9, Issue 3, 1991, pp. 1123-1128.*
Hoff et al., "Ohmic Contacts to semiconducting diamond using Ti/Pt/Au trilayer metallization scheme", Diamond and Related materials, col. 5, 1996, pp. 1450-1456.*

(Continued)

*Primary Examiner* — Jonathan Langman
(74) *Attorney, Agent, or Firm* — Bryan Cave LLP

(57) ABSTRACT

A diamond substrate having a contact, wherein the contact comprises a diamond-like-carbon (DLC) layer on at least part of a surface of the diamond substrate; and at least one metal layer on at least part of the surface of the DLC layer. Methods for producing the same and devices comprising such a substrate are also described.

13 Claims, 16 Drawing Sheets

OTHER PUBLICATIONS

Kaneko et al., "Development of a Synthetic Diamond Radiation Detector with a boron Doped CVD diamond contact", Nuclear Instruments and Methods in Physics Research Section A: Accelerators, Spectrometers, Detectors and Associated Equipment, vol. 422, Issues 1-3, Feb. 11, 1999, pp. 211-215.*

Omer et al., "Electrical Conductivity Improvement by Iodine doping for diamond-like carbon thin-films deposited by microwave surface wave plasma CVD"), Diamond and Related Materials, vol. 15, 2006, pp. 645-648.*

Kim et al., "The Effect of H2, N2, and N2O doping on DLC thin films deposited by PECVD method", Journal of Ceramic Processing Research, vol. 6, No. 3, 2005, pp. 205-208.*

Cuomo et al., Vapor Deposition Processes for Amorphous Carbon Films with sp3 Fractions Approaching Diamond, J. Appl. Physics 1991, vol. 70, issue 3, pp. 1706-1711.

Descamps et al., Clinical Studies of Optimised Single Crystal and Polycrystalline Diamonds for Radiotherapy Dosimetry, Radiation Measurements 2008, vol. 43, pp. 933-938.

Di Benedetto et al., Influence of Metal-Diamond Interfaces on the Response of UV Photoconductors, Diamond and Related Materials 2001, vol. 10, pp. 698-705.

Hillier et al., Microanalysis by Means of Electrons, J. Appl. Physics 1944, vol. 15, pp. 663-675.

Prins, Bipolar Transistor Action in Ion Implanted Diamond, Appl. Phys. Lett. 1982, vol. 41, issue 10, pp. 950-952.

Prins, Activation of Boron-Dopant Atoms in Ion-Implanted Diamonds, Phys. Rev. B 1988, vol. 38, issue 8, pp. 5576-5584.

Smedley et al., Electron Amplification in Diamond, (in: Advanced Accelerator Concepts: 12th Annual Advanced Accelerator Concepts Workshop) AIP Conference Proceedings 2006, vol. 877, pp. 672-679.

Tachibana et al., Correlation of the Electrical Properties of Metal Contacts on Diamond Films with the Chemical Nature of the Metal-Diamond Interface. I. Gold Contacts: A Non-Carbide-Forming Metal, Phys. Rev. B 1992, vol. 45, issue 20, pp. 11968-11974.

Tranchant et al., High Mobility Single Crystal Diamond Detectors for Dosimetry: Application to Radiotherapy, Diamond and Related Materials 2008, vol. 17, pp. 1297-1301.

Wedenig et al., CVD Diamond Pixel Detectors for LHC Experiments, Nuclear Physics B (Proc. Suppl.) 1999, vol. 78, pp. 497-504.

UK Search Report for GB 0819001.9 dated Feb. 18, 2009.

Yokoba et al., "Carrier transport mechanism of Ohmic contact to p-type diamond," J. Appl. Phys. vol. 81, issue 10, May 15, 1997, pp. 6815-6821.

Liechtenstein, "On Diamond-Like Carbon (DLC)-based radiation hard contacts for diamond detectors," Novel Radiation Hard CVD Diamond Detectors for Hadron Physics, Jun. 8-10, 2008, retrieved from the Internet Dec. 4, 2009, http://www-norhdia.gsi,de/index.php?mgid=6>.

European Search Report for Application No. EP 09 25 2428 dated Dec. 8, 2009.

* cited by examiner

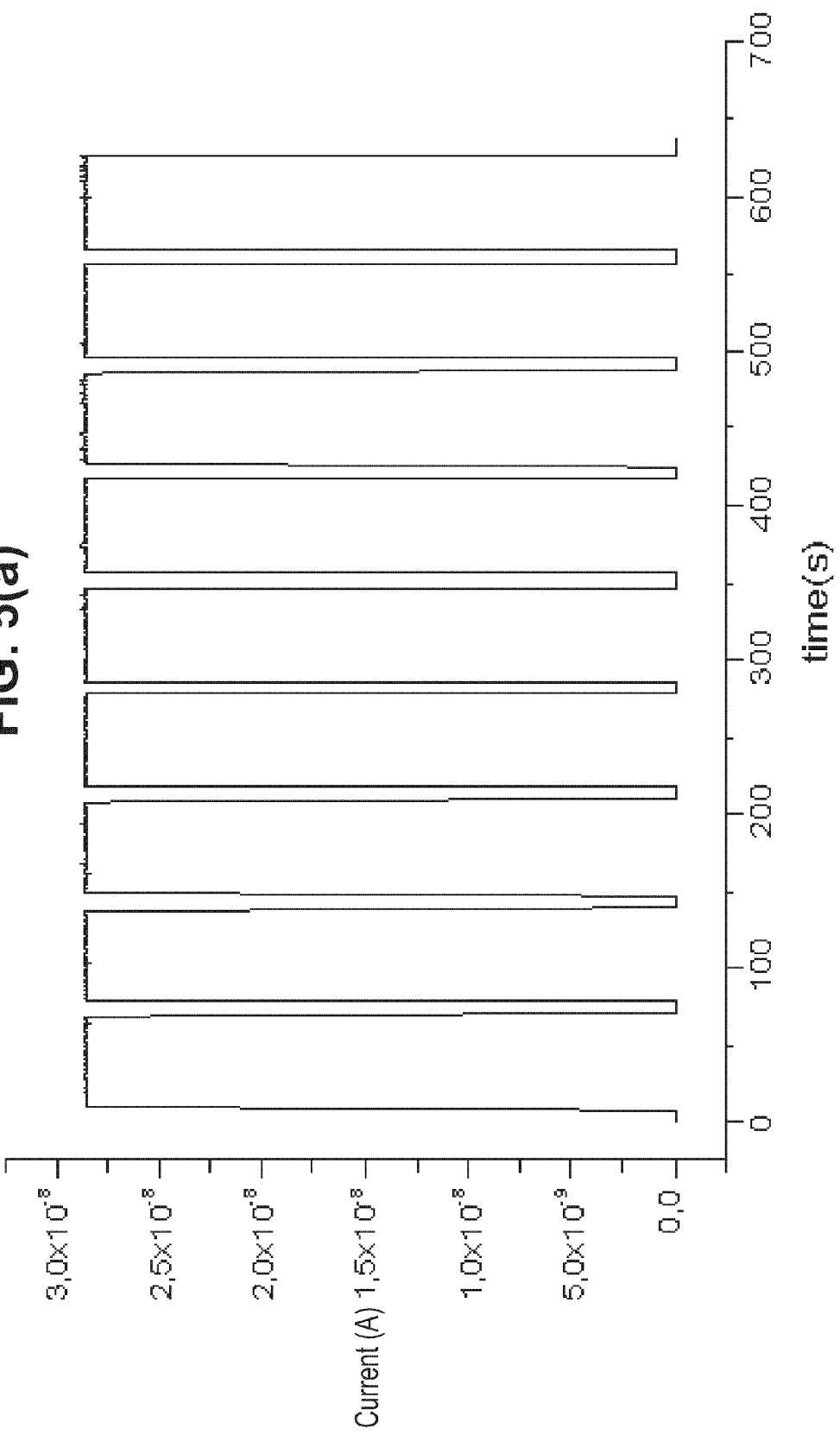

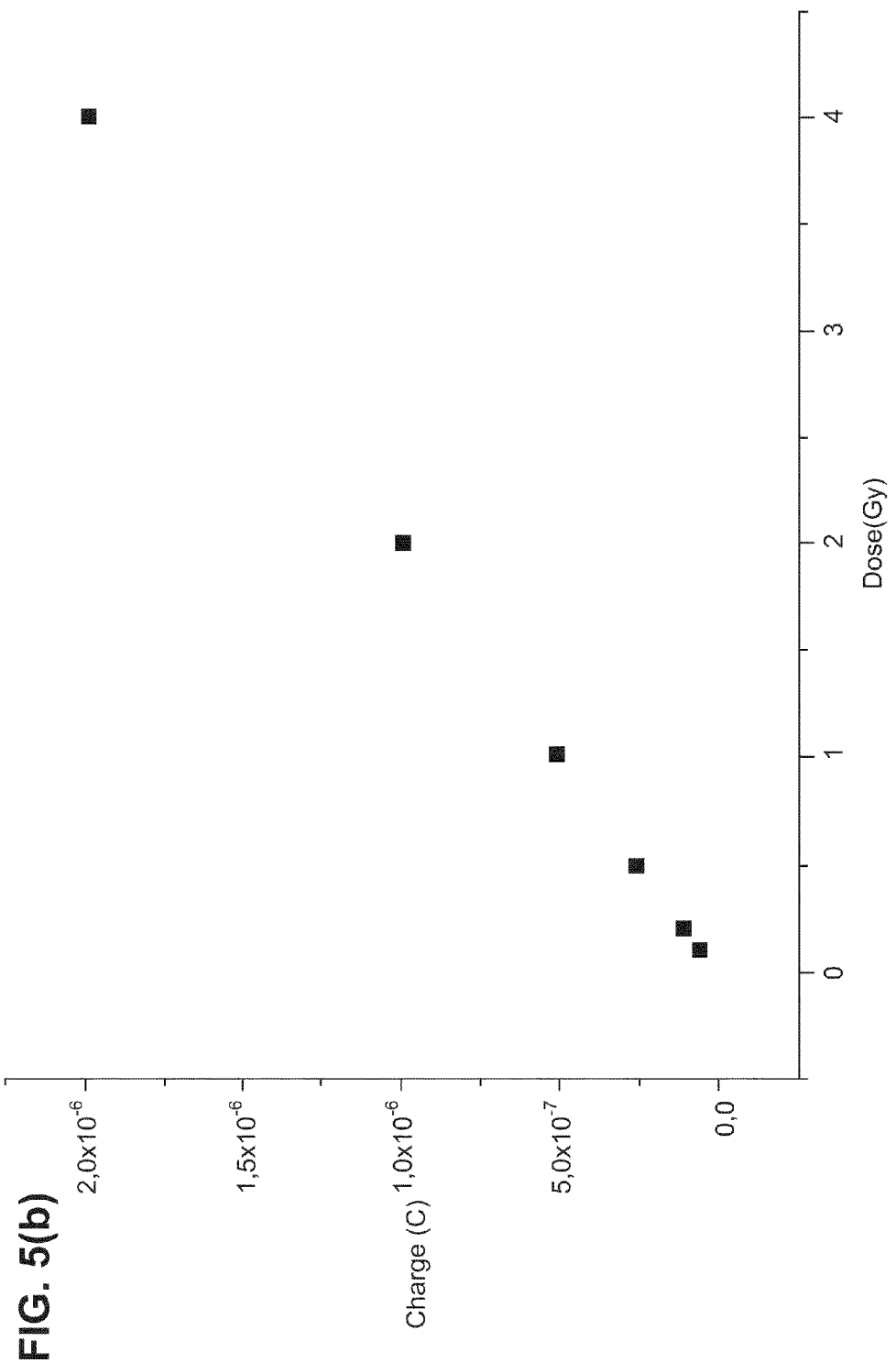

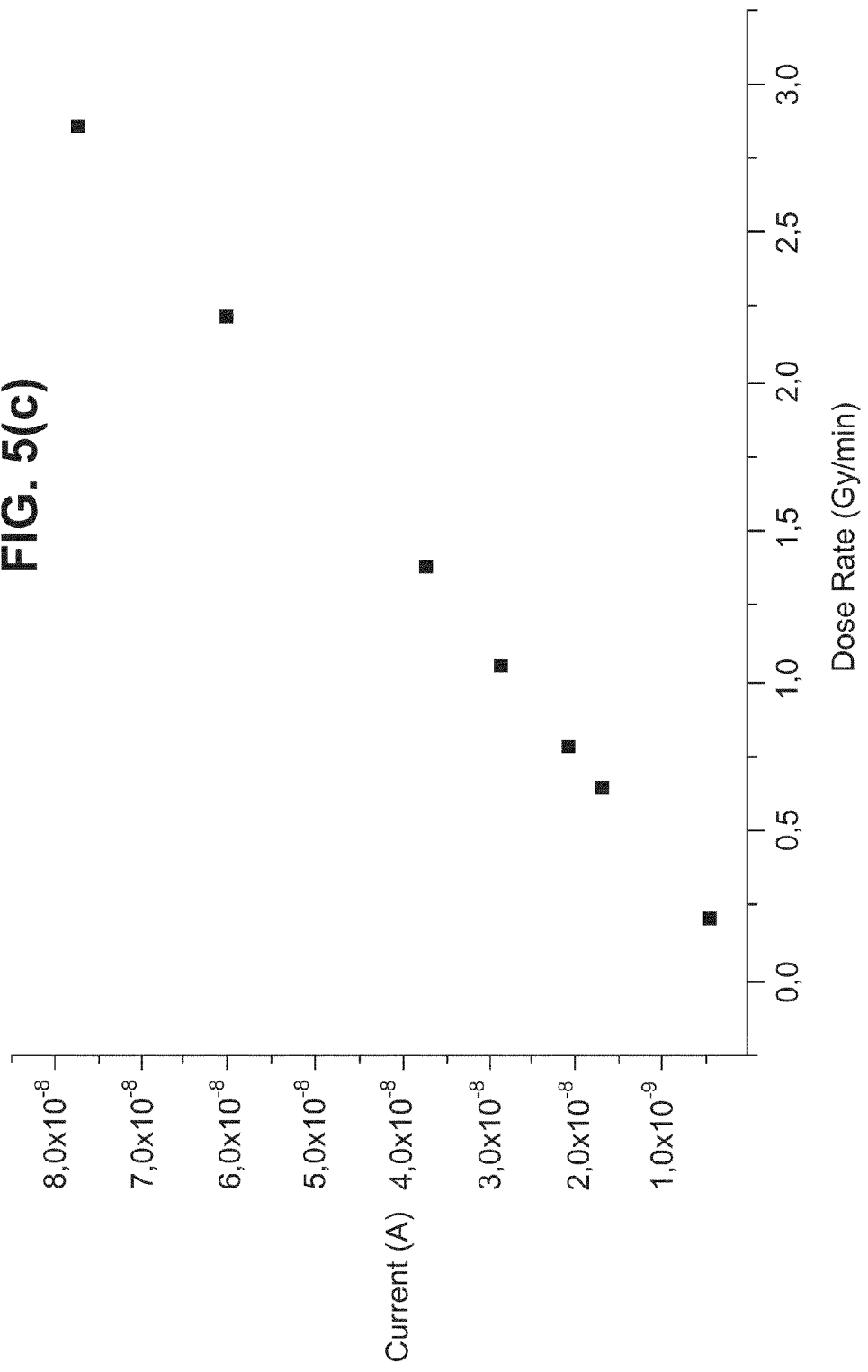

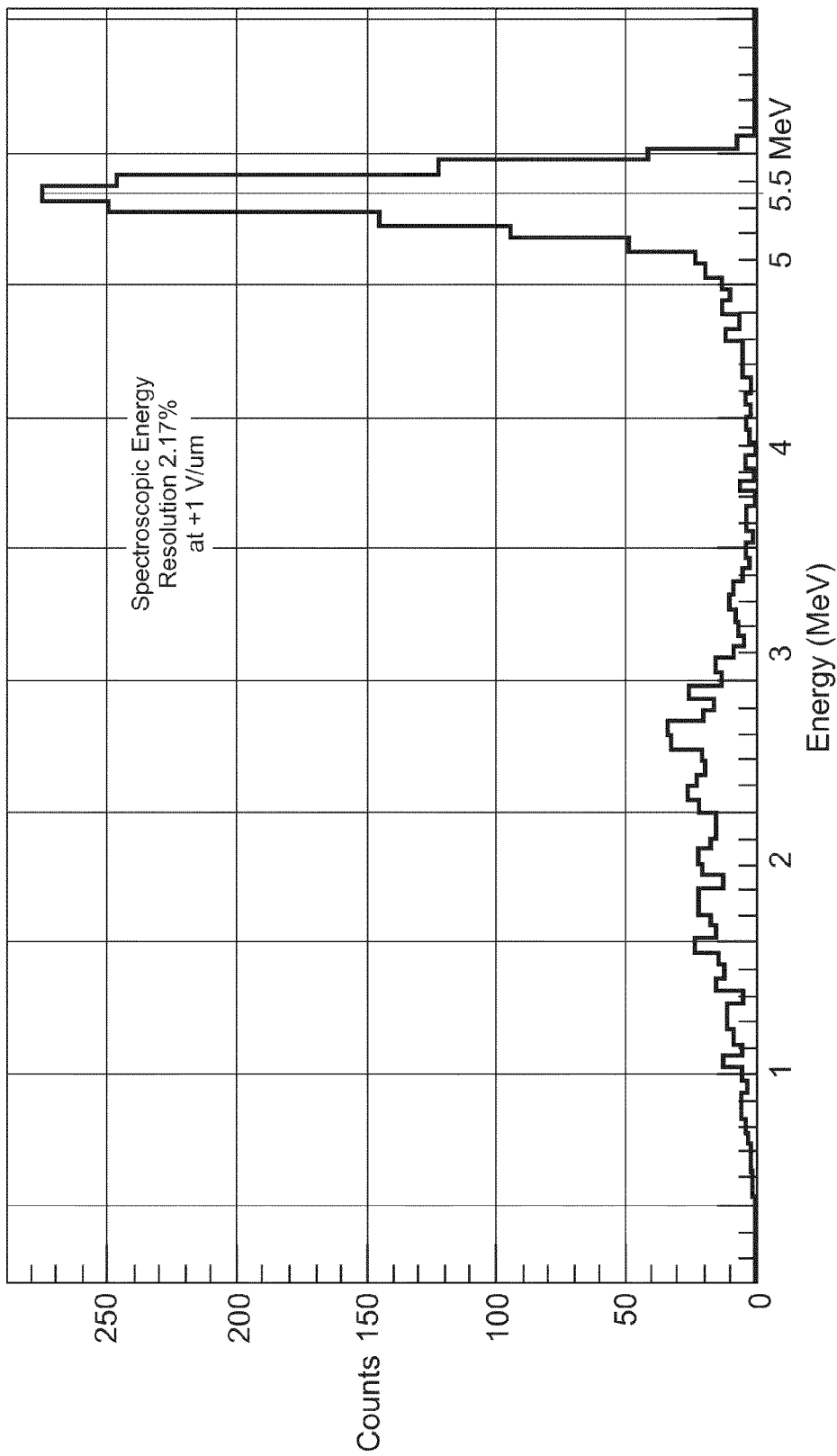

CONTACTS ON DIAMOND

All documents cited herein are incorporated by reference in their entirety.

The present invention relates to a method of forming contacts, particularly ohmic contacts, on diamond substrates. This invention also concerns diamond substrates having contacts and devices comprising such diamond substrates.

There are now many different types of devices, such as electronic devices and radiation detectors, which comprise diamond. For the successful operation of these devices it is necessary to provide an electrical contact between the diamond material and other parts of the device circuit. In particular, there is frequently a need to form a good ohmic contact on the diamond substrate.

Generally, in order to prepare a contact on a diamond substrate, a metal layer is deposited on a surface of the diamond. Wires from the circuit of the device can then be attached to the metal. Depending on the work function of the deposited metal layer and the properties of the diamond substrate, the contact may function as an ohmic contact or as a Schottky, or rectifying, contact.

Due to the inertness of diamond, it is difficult to strongly attach metal layers to a diamond surface. Strong attachment is desirable in order to prevent delamination of the metal layer from the diamond substrate, thereby increasing the lifetime of devices comprising such diamond substrates.

Previously, there have been three main approaches to forming low resistance ohmic contacts on diamond. One approach involves damaging the diamond surface in order to disrupt diamond $sp^3$ bonding. This may be done by several methods including low energy implantation with carbon or other ions having energies of less than about 1 keV. A second approach is to use carbide-forming metals like titanium or chromium, which create a hybrid metal-diamond interface material. A third approach includes doping diamond during growth or doping using ion implantation.

Ohmic contacts have been created on diamond by, for example, roughening the diamond surface, applying silver paint and annealing, as disclosed in Prins, Appl. Phys. Lett., 41 (1982), 950. However, such methods are not able to be readily reproduced in an industrial manufacturing environment.

Alternative methods for providing ohmic contacts on diamond have included applying alloys containing carbide forming elements, such as titanium and tantalum and annealing. Although such contacts tend to attach well to the diamond substrate, the performance of such contacts tends to be poor. The contacts often have high resistance and produce unstable signals.

Improved ohmic contacts on diamond have been prepared by highly doping with boron the area of the diamond surface on which the metal contact is to be formed. One method by which the diamond is doped with boron to a very shallow depth is by ion implantation. Such contacts are disclosed in, for example, EP 0 209 257 and Prins, Phys. Rev. B, 38 (1988), 5576.

Alternatively, good low resistance ohmic contacts have been formed on diamond by applying a layer of gold as described in R. Di Benedetto et al., Diamond and Related Materials, 10 (2001), 698-705. However, these contacts have poor stability and reliability. In particular, it has been found that the gold layer tends to readily peel off and become detached from the diamond substrate.

Accordingly, there is a need to provide a diamond substrate having a contact, preferably an ohmic contact, which as well as being a good electrical contact is also durable and stable and which has reduced likelihood of delamination. Stability of the signal generated by the contact is essential for reliable performance of devices containing diamond. Durability of the contact itself is essential in order to increase the lifetime of devices containing diamond.

According to the present invention there is provided a diamond substrate having a contact, wherein the contact comprises:
  (a) a diamond-like-carbon (DLC) layer on at least part of a surface of the diamond substrate; and
  (b) at least one metal layer on at least part of the DLC layer.

According to the present invention there is also provided a method of producing a contact on a diamond substrate, comprising:
  (a) depositing a diamond-like carbon (DLC) layer on the diamond substrate; and
  (b) depositing at least one metal layer on the DLC layer.

An advantage of the diamond substrate having a contact as described herein is that there is an improved attachment between the metal and the diamond, thereby improving the durability of the contact. Thus, the contact has a reduced tendency to undergo delamination. In this way, the diamond substrate and contact may be used to fabricate a device that is intended to be used repeatedly (for example under conditions of thermal cycling) and that has an increased lifetime. In particular, as the diamond substrate and the DLC layer are both carbon-based materials, there is a smooth transition between the substrate and the metal layer. This is in contrast to conventional contacts wherein a Ti or Cr adhesive layer is used between the substrate and the metal such that there are two abrupt transitions in the structure, one between the substrate and Ti or Cr layer and the other between the metal layer and the Ti or Cr layer.

A further advantage of the diamond substrate having a contact as described herein is that the contact enables a stable and reproducible signal to be obtained.

The term "ohmic contact" is used herein to describe a contact that is substantially non-blocking and where there is a substantially linear and symmetric current-voltage (I-V) curve. As the person skilled in the art will appreciate, the curve can vary from being linear while still maintaining ohmic behaviour and thus the term as used herein is intended to cover also these minor variations from linearity. Since an expected use of the contact is as a contact on diamond detectors comprised of intrinsic (i.e. non-conducting) diamond, the ohmicity of the contact may be evaluated under such circumstances, typically on a diamond substrate of known thickness (typically between about 0.05 mm and about 5 mm), with polished, opposed major surfaces, with a contact formed on a part or all of each of the opposed major surfaces. In order to evaluate the ohmicity of the contact, the detector is irradiated with radiation, such as beta particles from Sr-90, that will generate carriers uniformly through the diamond. The I-V curve for the contact is evaluated whilst under irradiation. The ohmicity of a contact may be such that the I-V curve for the contact varies from linear by about 10% or less, about 8% or less, about 5% or less, about 3% or less over an electric field range of about ±0.1 V/µm, about ±0.5 V/µm, about ±1 V/µm, about ±2 V/µm, about ±5 V/µm, about ±10 V/µm, and about 2% or less, about 1% or less, about 0.5% or less over an electric field range of about ±0.01 V/µm, about ±0.02 V/µm, about ±0.05 V/µm, about ±0.1 V/µm, where the electric field is the electric field between the two opposed contacts on the diamond substrate and is the voltage between the contacts divided by the thickness of the diamond substrate.

By "diamond-like carbon" is meant herein an amorphous, metastable form of carbon containing a significant proportion of $sp^3$ bonded carbon atoms. The exact proportion of $sp^3$ bonded atoms present depends on the substrate temperature during deposition and the technique used to generate the DLC layer. Typically, the proportion of $sp^3$ bonded atoms in the DLC layer of the present invention is about 10% or greater, about 20% or greater, about 30% or greater, about 40% or greater, about 50% or greater, about 60% or greater, or about 70% or greater. The proportion of $sp^3$ bonded atoms in the DLC layer of the present invention is typically about 90% or less, about 80% or less, about 70% or less, about 60% or less, about 50% or less. The proportion of $sp^3$ bonded atoms in the DLC layer of the present invention may be in the range from about 10 to about 90%, about 20 to about 80%, about 30 to about 70%, about 40 to about 60%. Preferably, the proportion of $sp^3$ bonded atoms is about 70% or less, about 60% or less or about 50% or less. The person skilled in the art will be familiar with the techniques which may be used in order to determine the proportion of $sp^3$ bonded atoms in the DLC layer of the present invention. In particular, electron energy loss spectroscopy (EELS) may be used as described in Hillier & Baker, Journal of Applied Physics, 15 (9), 663-675.

The DLC layer may be homogeneous meaning that the proportion of $sp^3$ bonded atoms is uniform throughout the layer. Alternatively, there may be a gradient of $sp^3$ bonded atoms in the DLC layer of the present invention such that in the portion of the DLC layer closest to the diamond substrate there is a higher proportion of $sp^3$ bonded atoms than in a portion more remote from the diamond substrate and closer to the metal layer of the contact. The variation in the proportion of $sp^3$ bonded atoms may be uniform such that a linear gradient is established moving from the surface of the DLC layer in contact with the diamond substrate to the surface of the DLC layer in contact with the metal layer. Alternatively, the variation in the proportion of $sp^3$ bonded atoms may be non-uniform (Cuomo et al, J. Appl. Phys., 70(3) 1991, 1706-1711).

The concentration of hydrogen in the DLC layer of the present invention is preferably about 20 atomic % or less, about 15 atomic % or less, about 10 atomic % or less, about 5 atomic % or less, about 2 atomic % or less, about 1 atomic % or less. It may be advantageous to have a small amount of hydrogen present in the DLC layer as it reduces the strain within the layer. More specifically, DLC will inevitably have dangling bonds. Where these dangling bonds are terminated with hydrogen rather than being forced to coordinate to other carbon atoms, there is a reduction in the strain of the resulting DLC material.

The DLC layer preferably is able to act as a quantum mechanical tunnelling junction. In this way electrons are able to tunnel through the DLC layer. Where the DLC layer acts as a quantum mechanical tunnelling junction, a particularly good ohmic contact is provided.

The DLC layer is typically deposited to a thickness of about 0.1 nm to about 10 nm, preferably from about 0.5 nm to about 5 nm, more preferably from about 1 nm to about 3 nm. In order for the DLC layer to be able to act as a quantum mechanical tunnelling junction, a thin layer is preferred. A DLC layer having a thickness of from about 1 nm to about 3 nm is particularly preferred as at this thickness the DLC layer functions as a particularly good quantum mechanical tunnelling junction because it allows for overlap of the wavefunctions of the diamond layer and the metal layer.

The DLC layer may be deposited on the diamond substrate by any suitable technique. Typically, the DLC layer is deposited by sputtering of a graphite target. Preferably, the DLC layer is deposited by argon sputtering of a graphite target.

In one embodiment, where the DLC layer is deposited by argon sputtering of a graphite target, the current density of the graphite target may be in the range from about 6 to about 12 $mA/cm^2$, about 7 to about 11 $mA/cm^2$, about 8 to about 10 $mA/cm^2$, about 9 $mA/cm^2$, preferably about 8.7 $mA/cm^2$; the vacuum pressure may be in the range from about $6\times10^{-3}$ to about $12\times10^{-3}$ mbar, about $7\times10^{-3}$ to about $11\times10^{-3}$ mbar, $8\times10^{-3}$ to about $10\times10^{-3}$ mbar, preferably about $9\times10^{-3}$ mbar; and the pressure after argon injection is in the range from about $3\times10^{-3}$ to about $9\times10^{-3}$ mbar, about $4\times10^{-3}$ to about $8\times10^{-3}$ mbar, about $5\times10^{-3}$ to about $7\times10^{-3}$ mbar, preferably about $6\times10^{-3}$ mbar. The argon may be deposited for a period of about 20 seconds or more, about 25 seconds or more, about 30 seconds or more, about 35 seconds or more, about 40 seconds or more, about 45 seconds or more, about 50 seconds or more. Preferably, the deposition time is about 40 seconds.

The DLC layer may be deposited over a part of the diamond substrate surface or over the whole diamond substrate surface. Where the diamond substrate is to be used in a radiation detector, the DLC layer typically covers the whole of one surface of the substrate. In some embodiments, a DLC layer may be formed over part or all of two surfaces of the diamond substrate in order to make two separate contacts. The use of two contacts is particularly advantageous in radiation detector applications, for example.

The DLC layer is able to act as a seed layer and improves the attachment to the diamond substrate of the subsequently deposited metal layer. The DLC layer has an advantage of reducing delamination of the metal layer from the diamond substrate and hence improves the durability of a device having such a contact. In this regard, surprisingly good adhesion has been observed for the contacts of the present invention. There are several ways in which the adhesion of a film to a substrate may be measured in the art. The most commonly used technique is the so-called "adhesive tape test" (sometimes also called the "Scotch Tape™ test"). In this test, an adhesive tape is applied to the film and removed. If the film remains adhered to the substrate then the film is deemed to exhibit good adhesion. The contacts of the present invention pass this test in that the metal layer remains adhered to the contact.

The strength of adhesion of the contacts may also be evaluated using a "pull test". The use of such tests is well known in the art. In this instance, a 25 µm Al wire was attached to the surface of the contact using a wire wedge bonder (Kulick and Soffa Model 4523). The wire was then pulled using a pull tester (Dage Series 4000 using a WP100 Cartridge), applying a load that rises to a maximum value of 20 g. Under these conditions, the wire is expected to break before the contact metal decoheres and if this occurs, the contact is classed as a good contact. The inventors understand that this is a standard test for contact adhesion.

The present inventors have also subjected the contacts of the present invention to more rigorous tests. In particular it has been found that the metal layer remains adhered to the substrate after being subjected to 5 minutes of ultra-sonication in water at a temperature of about 25° C., at a frequency of about 35 kHz and at a power of about 120 W. An example of a commercially available ultrasonic bath which may be used for performing this test is an AOYUE 9080 ultrasonic cleaner. This test is considered to provide a particularly useful measure of adhesion as it is representative of a cleaning step to which such contacts are likely to be subjected during processing to form an electronic device. In this regard, it is important that delamination does not occur at this stage. As will be illustrated in the examples section below, it has surprisingly been found that the contacts of the present invention do not delaminate under such conditions.

The metal layer may be any suitable metal from which an electrical contact may be made. In one embodiment, the metal is an essentially pure metal i.e. a metal having a purity of 99.9% or greater. Typically, the metal is a noble metal, such as copper, ruthenium, rhodium, palladium, silver, osmium, iridium, platinum, molybdenum or gold. The metal may be aluminium. Preferably, the metal is copper, palladium, silver, platinum or gold. Alternatively, the metal is an alloy of one or more of copper, ruthenium, rhodium, palladium, silver, osmium, iridium, platinum, molybdenum or gold, for example alloys of gold and platinum may be used. More preferably, the metal is gold or platinum. More preferably, the metal is gold. The use of gold or platinum is particularly preferred when an ohmic contact is required. The use of aluminium is preferred when a Schottky contact is required.

Preferably, the metal has a work function that is higher than the work function of the diamond substrate in order that electrons are driven from the diamond substrate to the metal layer. Gold and platinum are examples of metals having a work function higher than that of the diamond substrate.

The metal may be deposited on the DLC layer in any suitable way, such as by evaporation or by sputter deposition. Preferably, the metal is sputter deposited on the DLC layer. Where the metal is an alloy, the metal may be formed over the DLC layer by co-sputtering. The metal layer may be deposited over part or all of the DLC layer. Preferably the metal layer is deposited over about 50% or more, about 60% or more, about 70% or more, about 80% or more, about 90% or more, about 95% or more, about 99% or more, about 100% of the DLC layer.

The thickness of the metal layer may be selected according to the application to which the contact is intended to be put. For example, metal layers of 10 nm or less are useful for creating a semi-transparent electrode that allows for direct detection of shallow penetrating radiation like ultra-violet (UV) or soft X-rays. For other applications, the metal layer may be from about 10 nm to 500 nm thick, from about 50 nm to about 400 nm thick, or from about 100 nm to about 200 nm thick. Where the metal layer is gold, the layer is typically from about 100 nm to about 200 nm thick. Where the metal layer is platinum, the layer is typically from about 8 nm to 16 nm thick.

More than one metal layer may be formed over the DLC layer. In one embodiment, two metal layers are formed over the DLC layer. In another embodiment, three metal layers are formed over the DLC layer. Preferably, two metal layers are formed over the DLC layer.

The contact formed on the diamond may be an ohmic contact. Alternatively, the contact may be a Schottky contact. When the diamond substrate is for use in devices such as radiation detectors, ohmic contacts are particularly preferred. For electronics devices comprising diamond, both ohmic and Schottky contacts may be required.

Where the contact is an ohmic contact, the at least one metal layer preferably has a work function higher than the work function of the diamond substrate.

Embodiments where the metal is platinum or gold or platinum and gold have been found to produce particularly good ohmic contacts.

Preferably, a platinum layer is deposited on the DLC layer and a gold layer is deposited on the platinum layer. In this way a good ohmic contact is formed, which has a stable signal and which is durable.

In any of the embodiments of the present invention, the diamond substrate may be natural diamond or synthetic diamond, such as chemical vapour deposition (CVD) diamond or high pressure high temperature (HPHT) diamond. The diamond substrate may be single crystal diamond or polycrystalline diamond. Preferably, the diamond substrate is CVD diamond. Preferably, the diamond substrate is single crystal diamond. More preferably, the diamond substrate is CVD single crystal diamond.

The surface of the diamond on which the contact is provided may be cleaned prior to deposition of the DLC layer using known techniques. For example, where the diamond substrate is single crystal CVD diamond, suitable cleaning and surface preparation techniques are well known to the person skilled in the art. In particular, the surface may be a polished surface, preferably a surface which has been polished by a combination of mechanical lapping and polishing optimised to minimise surface and subsurface damage. Examples of such a technique are described in WO01/96633 and WO01/96634, which are hereby incorporated by reference in their entirety. Alternatively or in addition, a surface of the diamond on which the contact is provided may be prepared by a non-mechanical processing technique, for example using an Ar/Cl etch as described in WO2008/090511. In one embodiment, the diamond substrate is cleaned in a mixture of sulphuric acid and potassium nitrate.

In one embodiment, the contact comprises a layer of DLC deposited to a thickness of about 0.1 nm to about 10 nm, preferably from about 0.5 nm to about 5 nm, more preferably from about 1 nm to about 3 nm, wherein the proportion of $sp^3$ bonded atoms in the DLC layer of the present invention may be in the range from about 10% to about 90%, about 20% to about 80%, about 30% to about 70%, about 40% to about 60%; and at least one metal layer, preferably two metal layers, wherein the at least one metal has a work function higher than the work function of the diamond substrate and is preferably selected from platinum and/or gold. Where more than one metal layer is present, preferably it is the metal of the layer closest to the diamond which has a higher work function than the work function of the diamond substrate.

According to a further embodiment of the present invention, there is provided a device comprising any of the diamond substrates having a contact as described herein.

The use of diamond substrates having a contact as described herein in radiation detectors is particularly advantageous. When radiation detectors comprising diamond are irradiated, electron hole pairs are generated in the diamond. The performance of radiation detectors comprising diamond is limited by the ability of the contact to extract or inject electrons from or into the diamond substrate and the speed at which this occurs. Diamond substrates having ohmic contacts as described herein provide improved performance as radiation detectors because they allow for fast extraction or injection of electrons. Radiation detectors include those used for nuclear and environmental monitoring, radiotherapy dosimetry, deep ultraviolet (UV) detection, in space and astronomy applications and in high energy physics applications.

Specific embodiments of the present invention will now be described by way of example with reference to the following figures in which.

Figure 4A:
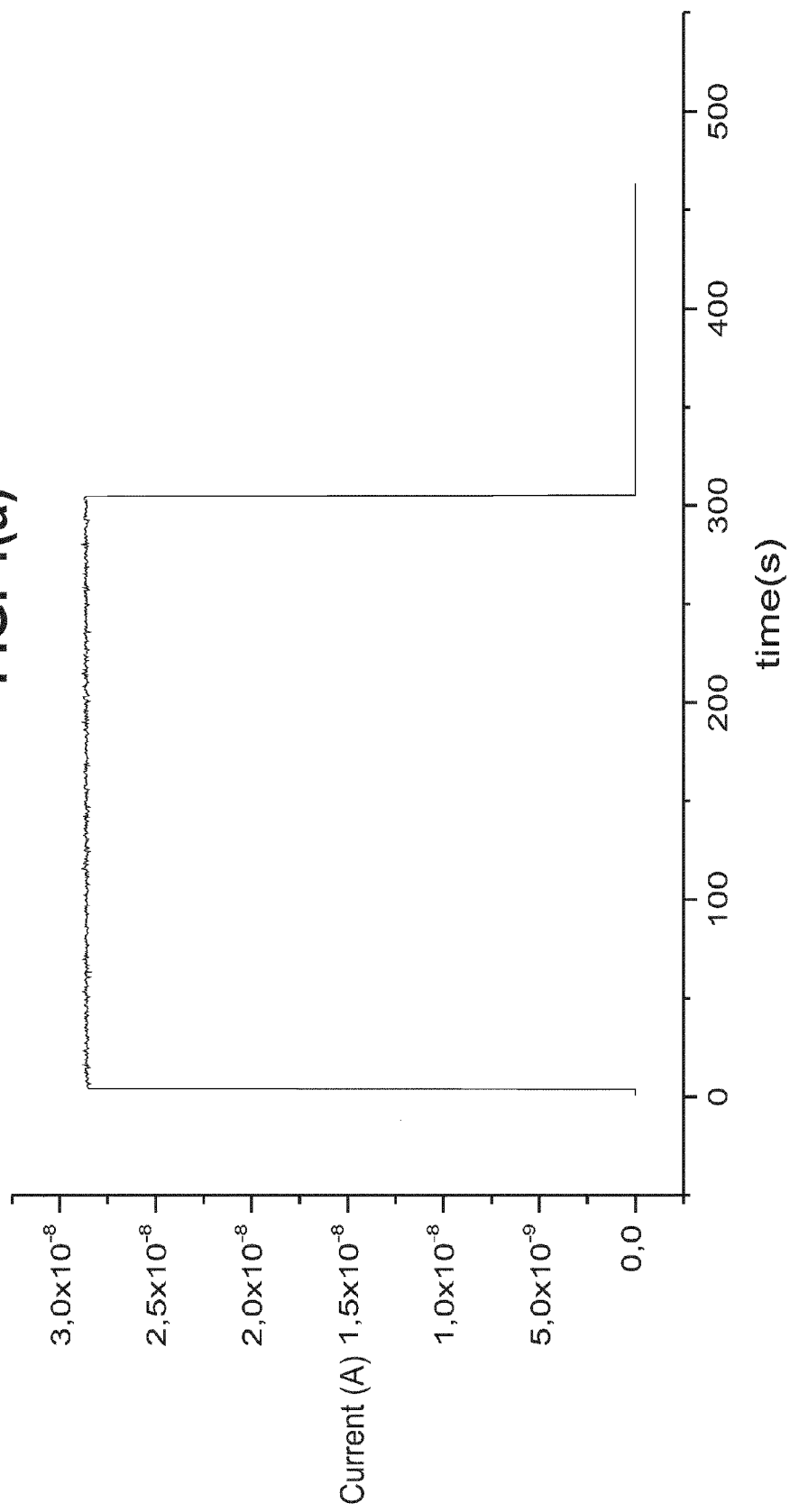
Figure 7:
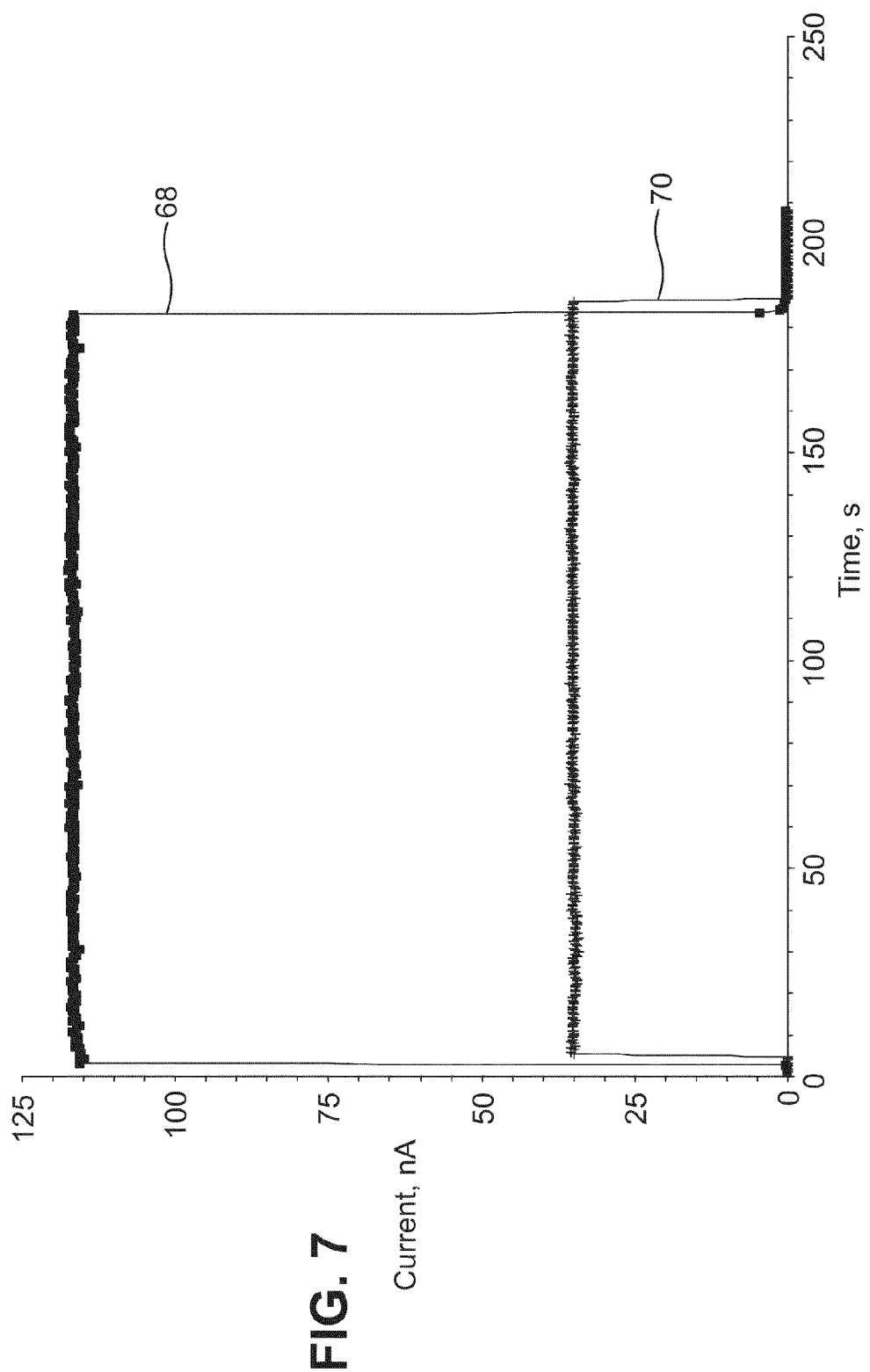

FIGS. 4(a) and (b) show current-time graphs of a diamond substrate having DLC/Pt/Au contacts exposed to a Co-60 gamma ray source;

FIG. 5(a) shows a current-time graph of a diamond substrate having DLC/Pt/Au contacts exposed to a Co-60 gamma ray source;

FIG. 5(b) shows a charge-dose graph of a diamond substrate having DLC/Pt/Au contacts exposed to a Co-60 gamma ray source which illustrates the linearity of the signal with absorbed dose;

FIG. 5(c) shows a current-dose rate graph of a diamond substrate having DLC/Pt/Au contacts exposed to a Co-60 gamma ray source which illustrates the linearity of the signal with dose rate;

FIG. 6 shows the spectroscopic response of a diamond substrate having DLC/Pt/Au contacts exposed to Am-241 alpha radiation;

FIG. 7 shows a comparison of a current-time graph for a DLC/Pt/Au contact according to the present invention and a gold contact exposed to a Co-60 gamma ray source.

Figure 8:
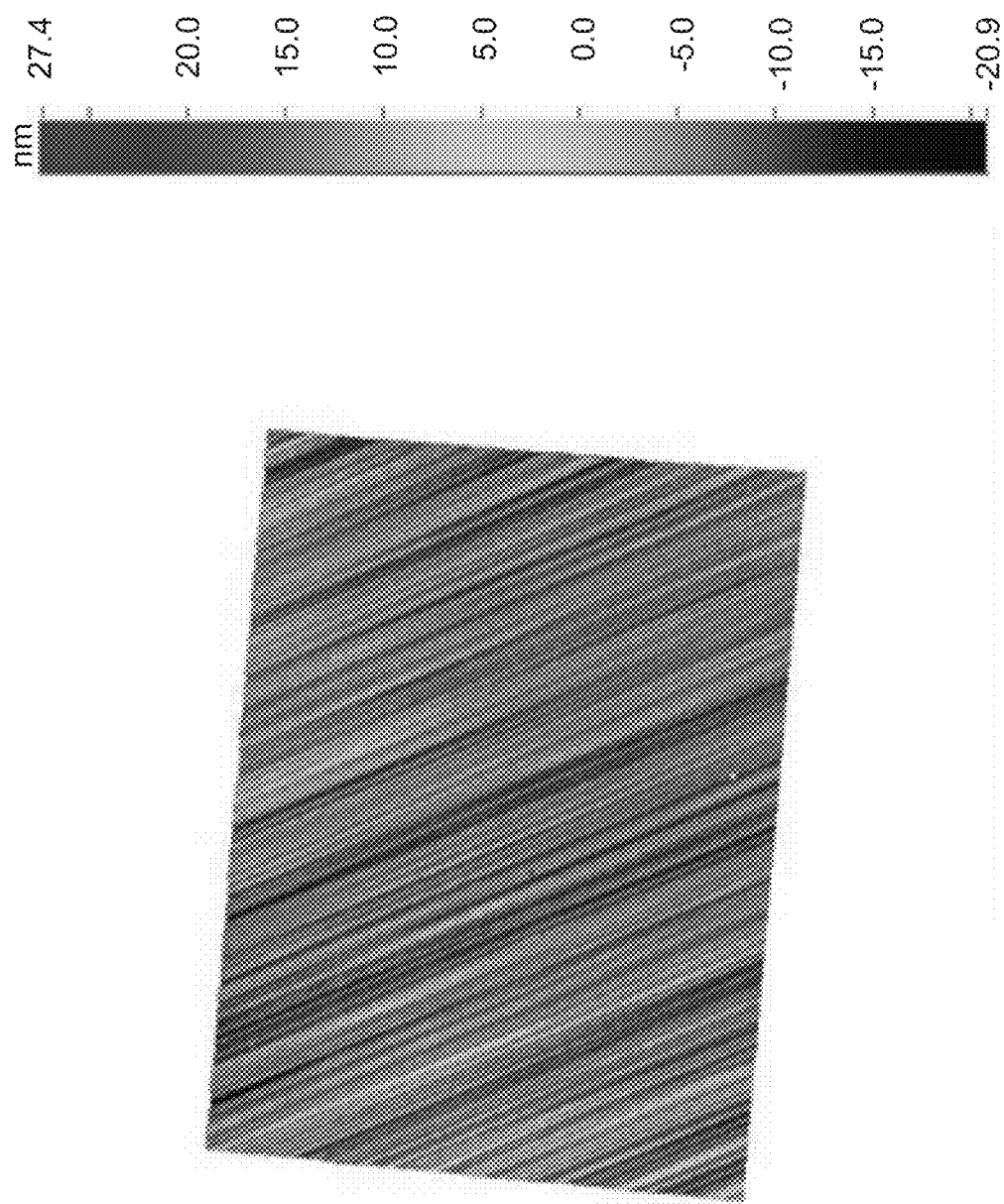
Figure 9:
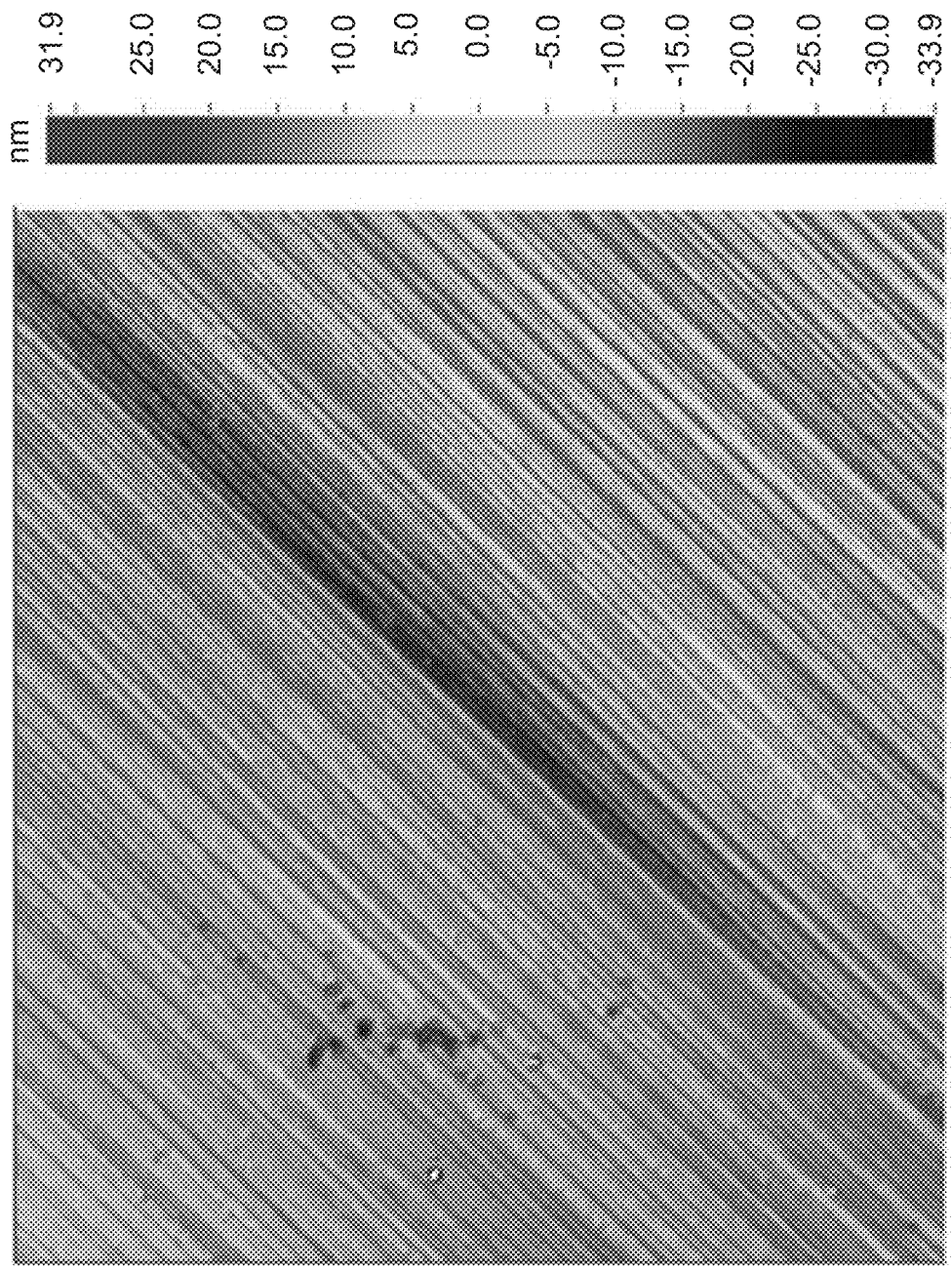
Figure 10:
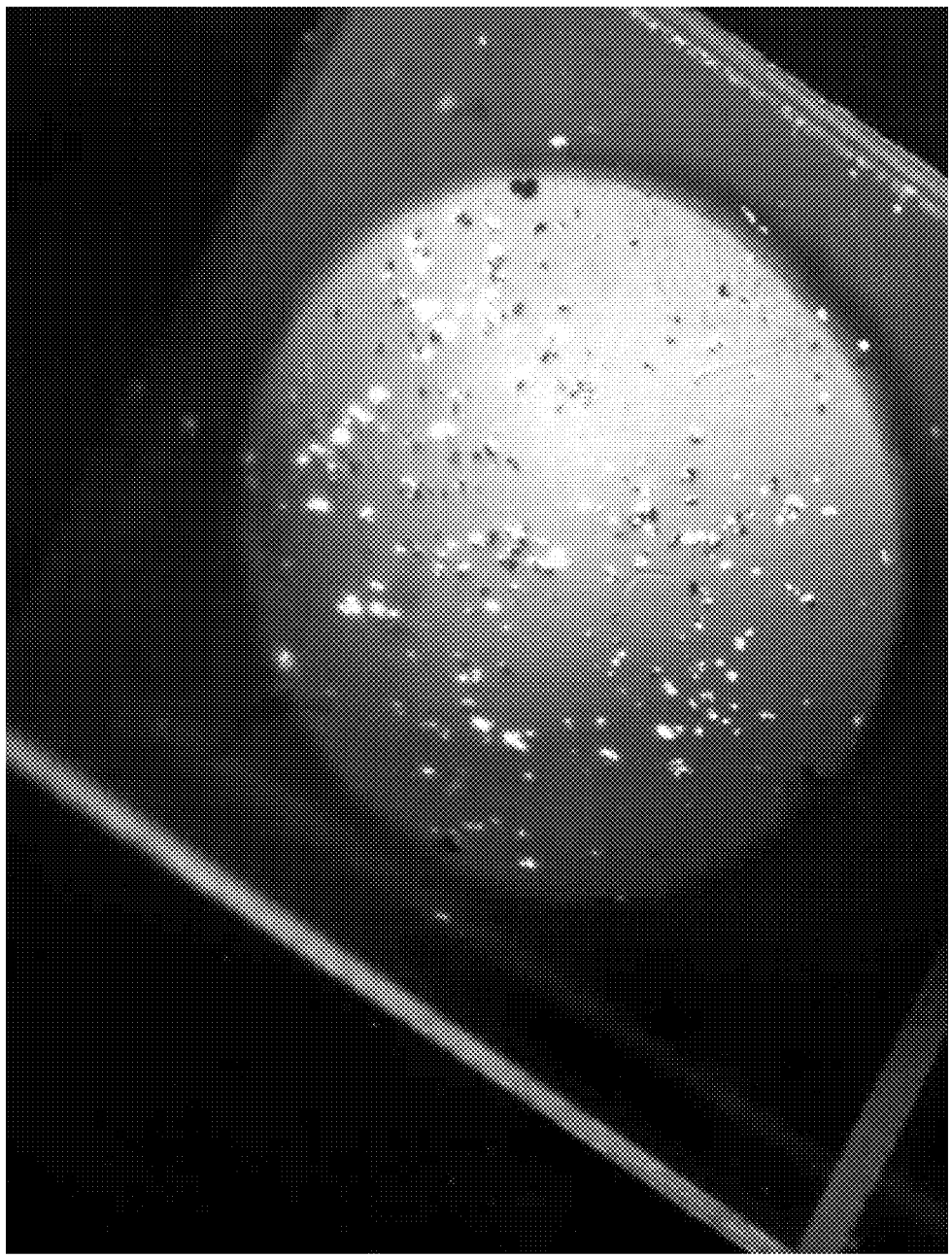
Figure 11:
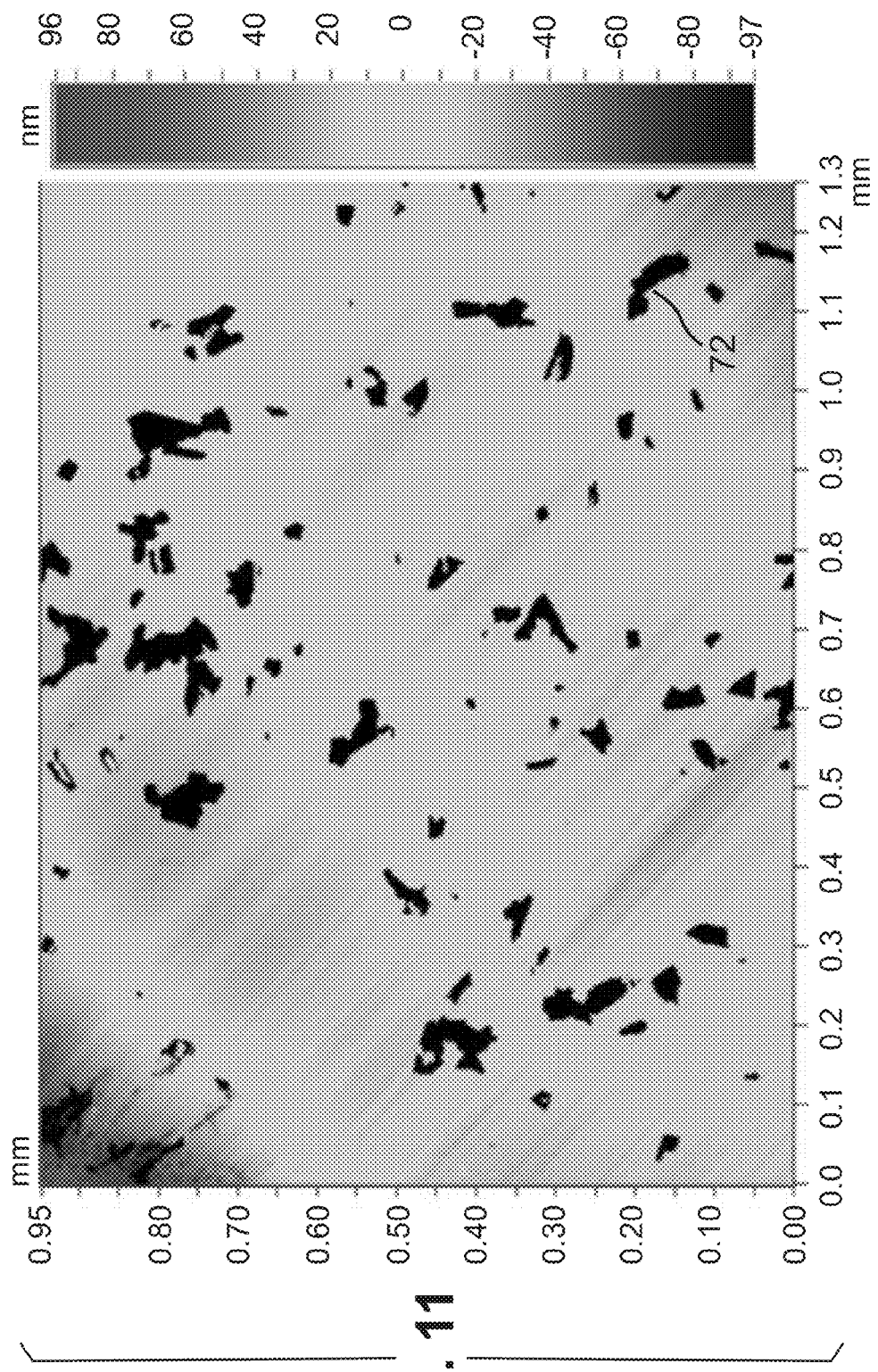
Figure 12:
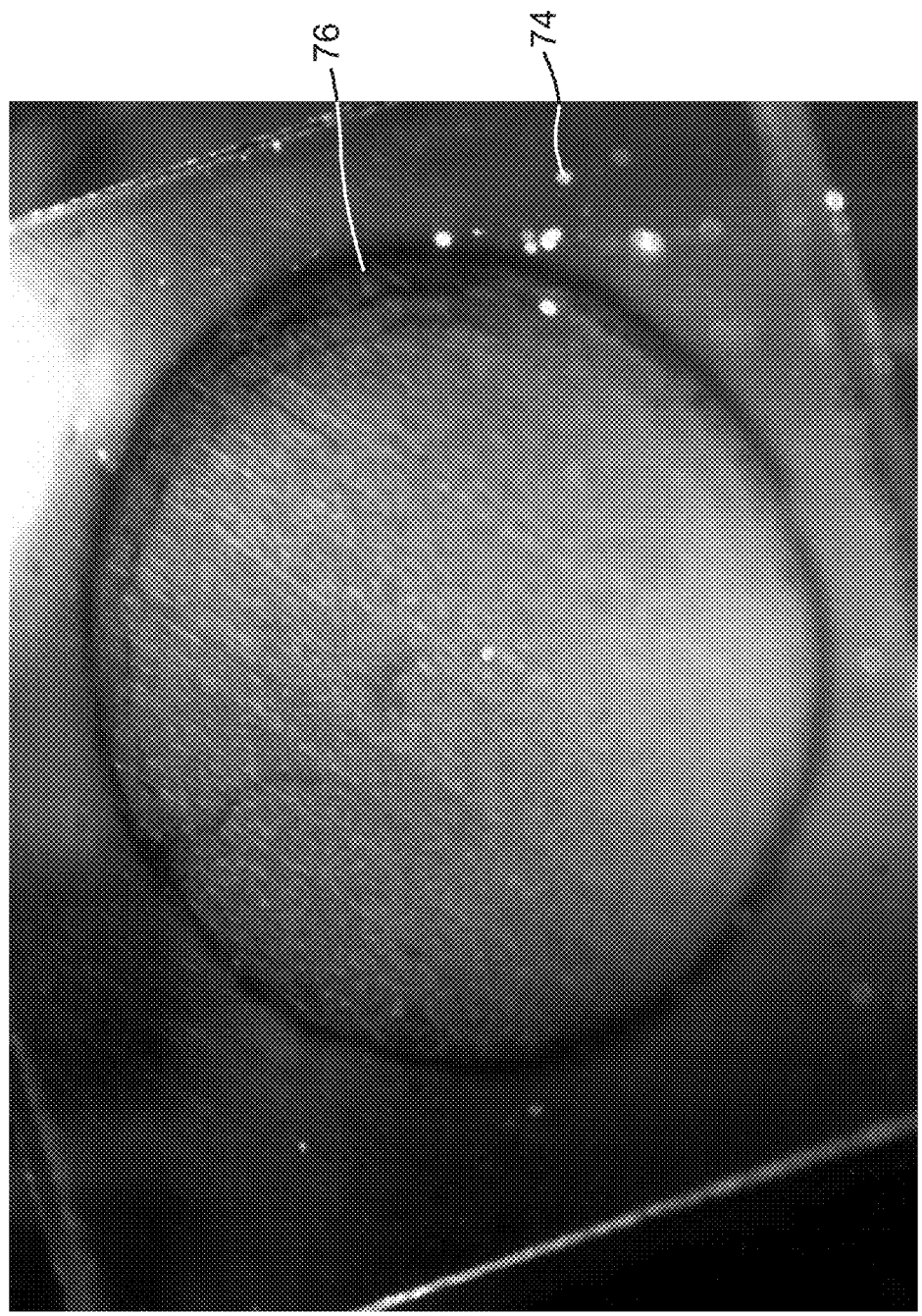
Figure 13:
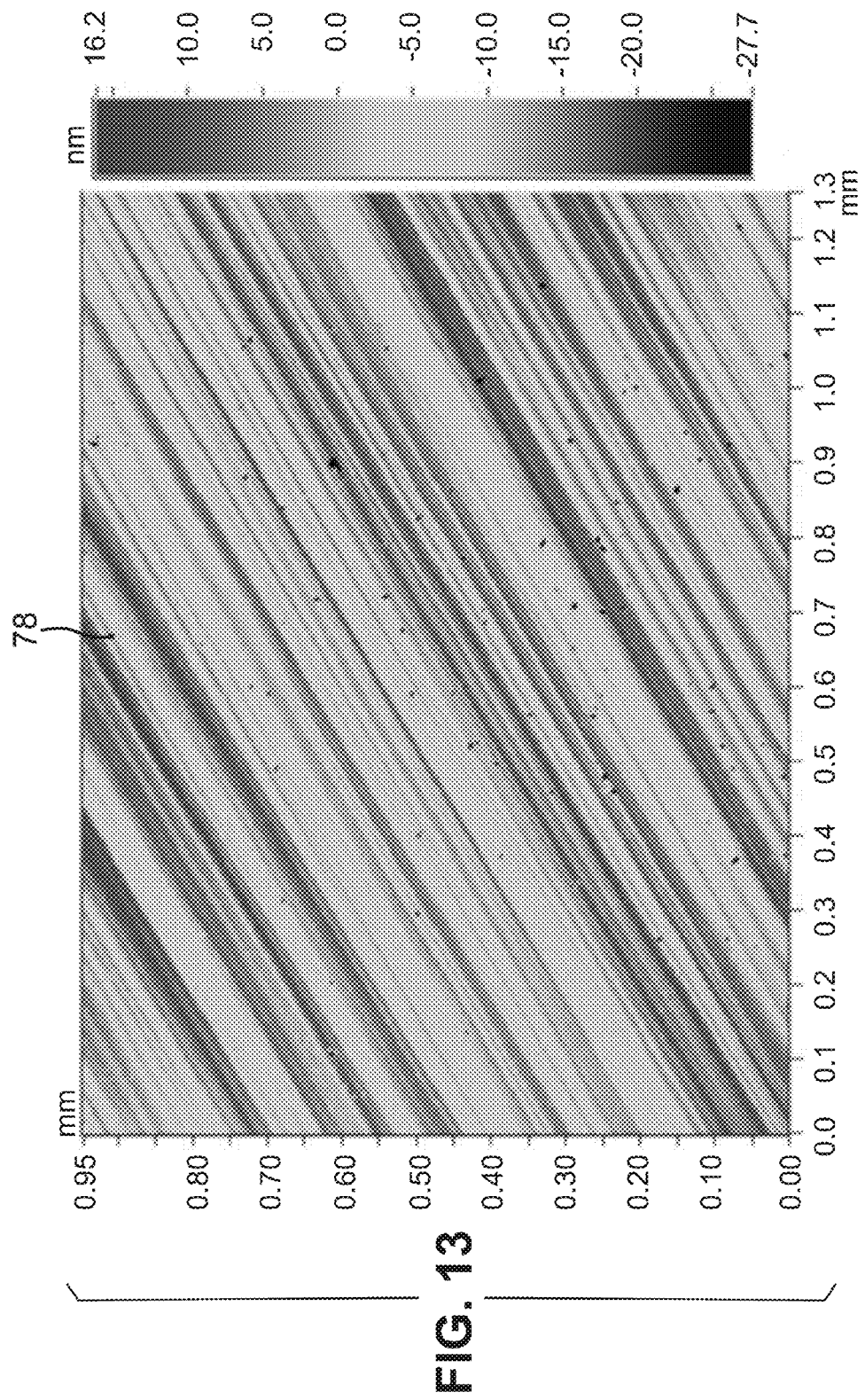
Figure 14:
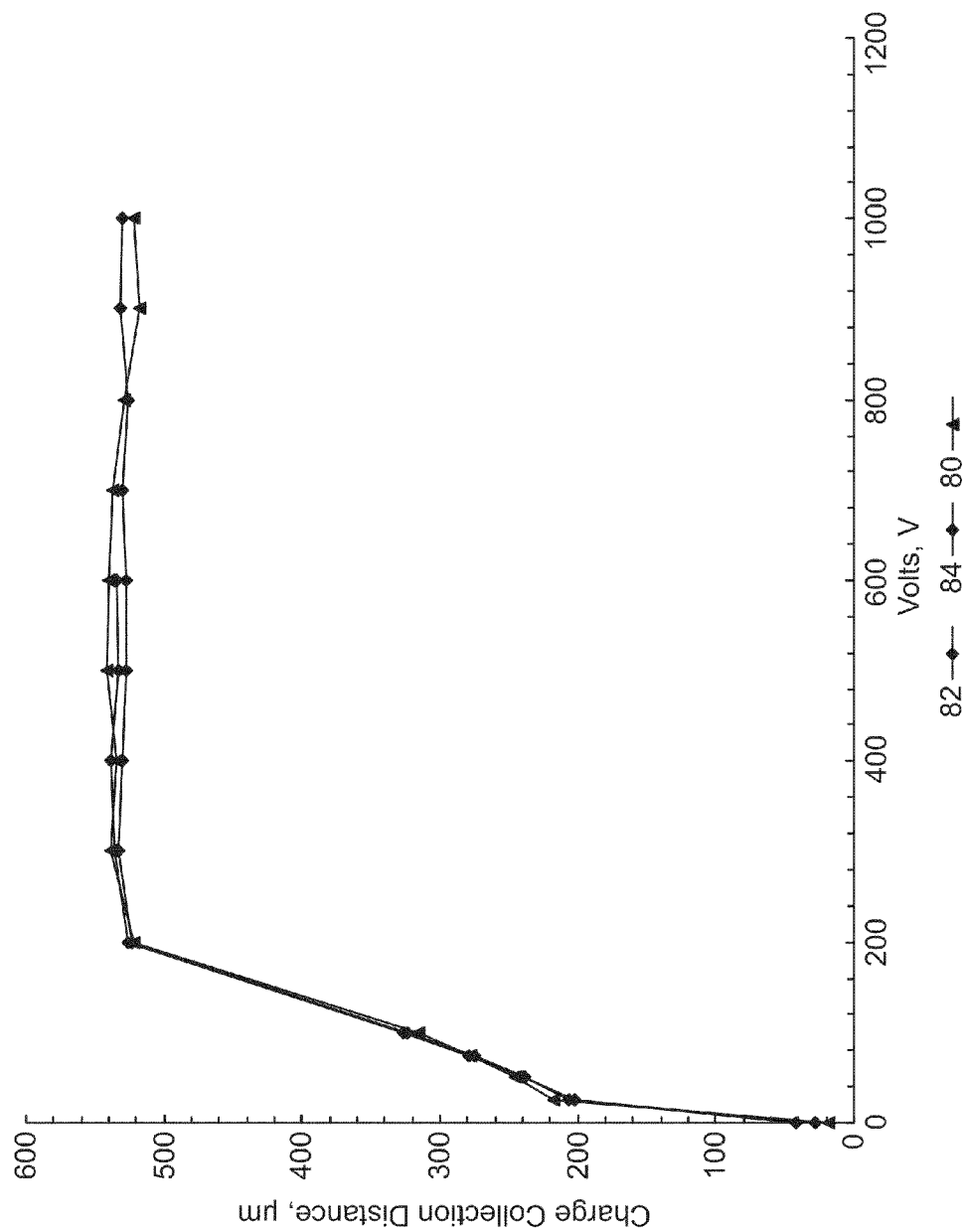

FIG. 8 shows an optical interferometry image of an as-deposited Au sputtered face of a diamond substrate having an Au contact;

FIG. 9 shows an optical interferometry image of an as-deposited DLC/Pt/Au sputtered face of a diamond substrate having a DLC/Pt/Au contact;

FIG. 10 shows an optical image of the surface of a diamond substrate having a DLC/Pt/Au contact after 5 minutes of ultrasonication in water;

FIG. 11 shows an optical interferometry image of the surface of a diamond substrate having a DLC/Pt/Au contact after 5 minutes of ultrasonication in water;

FIG. 12 shows an optical image of the surface of a diamond substrate having an Au contact after 5 minutes of ultrasonication in water;

FIG. 13 shows an optical interferometry image of the surface of a diamond substrate having an Au contact after 5 minutes of ultrasonication in water; and FIG. 14 shows the charge collection efficiency of a diamond substrate having DLC/Pt/Au contacts under irradiation with Sr-90 electrons at an applied electric field of $0.377 V/\mu m$, as compared to Cr/Au and TiW contacts.

Figure 1:
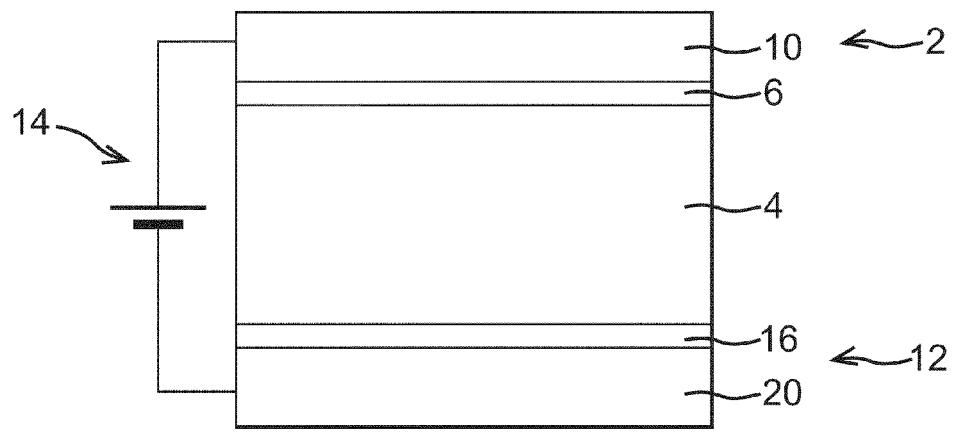
FIG. 1 shows a schematic diagram of a cross-section of a diamond substrate for use in a radiation detector having two DLC/Au contacts.

In FIG. 1 there is a diamond substrate (4) having two contacts (2, 12) for use in a radiation detector. The diamond substrate (4) has a layer of DLC (6) on one surface and a second layer of DLC (16) on its other surface. Over each DLC layer is a layer of gold (10, 20). A bias is applied between the two contacts (2, 12) using circuitry (14) in the radiation detector. Exposure of the diamond substrate (4) to radiation results in the generation of electron-hole pairs (not shown). The current generated is indicative of the quantity of radiation to which the diamond has been exposed.

Figure 2:
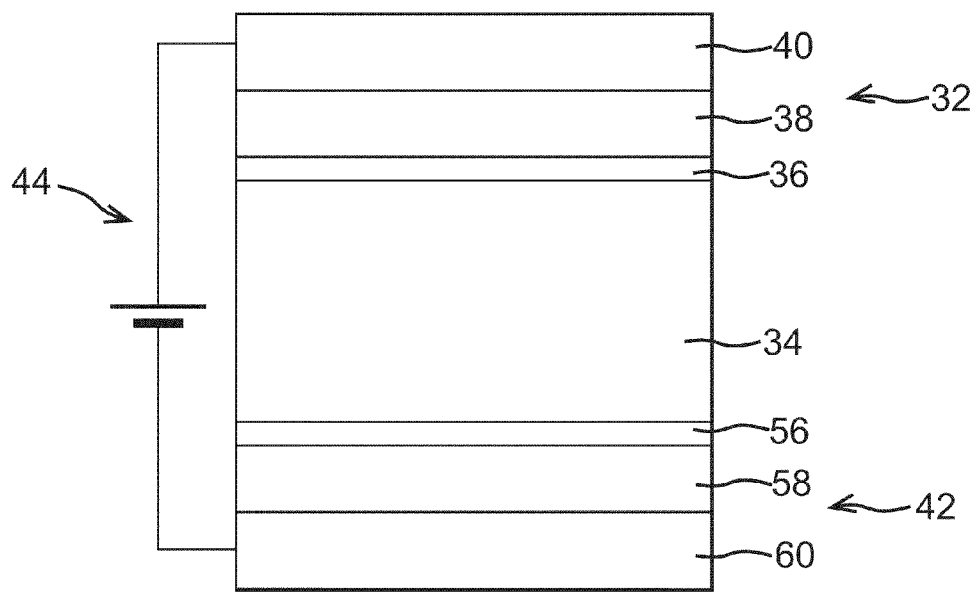
FIG. 2 shows a schematic diagram of a cross section of a diamond substrate for use in a radiation detector having two DLC/Pt/Au contacts.

In FIG. 2 there is a diamond substrate (34) having two contacts (32, 42) for use in a radiation detector. The diamond substrate (34) has a layer of DLC (36) on one surface and a second layer of DLC (56) on its other surface. Over each DLC layer is a layer of platinum (38, 58). Over each platinum layer (38, 58) is formed a layer of gold (40, 60). A bias is applied between the two contacts (32, 42) using circuitry (44) in the radiation detector. Exposure of the diamond substrate (34) to radiation results in the generation of electron-hole pairs (not shown). The current generated is indicative of the quantity of radiation to which the diamond has been exposed.

EXAMPLE 1

A single crystal CVD diamond substrate having a thickness of 522 μm was cleaned by immersion in a beaker containing a mixture of boiling concentrated sulphuric acid (50 ml) and potassium nitrate (5 g) at approximately 300° C. for about 5 minutes. The mixture was allowed to cool and was then decanted from the beaker. The diamond substrate was washed with deionized water and was then subjected to ultrasonication for 10 minutes in deionized water. The diamond substrate was dried with a dry air duster.

A diamond-like carbon (DLC) layer was deposited on the diamond substrate by DC magnetron argon ion beam sputtering of a graphite sputtering target. The current density of argon ions on the carbon sputtering target was $8.7 mA/cm^2$. The pressure was $6 \times 10^{-3}$ mbar during injection of argon gas. The diamond substrate was maintained at room temperature and deposition was carried out for 40 seconds. A DLC layer of about 3 nm thickness was obtained. The thickness of the DLC layer was measured using an Optical Profiler WYKO NT9100 from Veeco.

EXAMPLE 2

A diamond substrate/DLC layer was prepared as described in Example 1.

A platinum layer was deposited on the DLC layer by DC magnetron argon ion beam sputtering of a platinum sputtering target. The current applied to the 54 mm diameter graphite target was 200 mA. The pressure was $6 \times 10^{-3}$ mbar during injection of argon gas. The diamond substrate/DLC layer was maintained at room temperature and platinum deposition was carried out for 60 seconds. A platinum layer of 16 nm thickness was obtained. The thickness of the platinum layer was measured using an Optical Profiler WYKO NT9100 from Veeco.

EXAMPLE 3

A diamond substrate/DLC layer was prepared as described in Example 1.

A gold layer was deposited on the DLC layer by DC magnetron argon ion beam sputtering of a gold sputtering target. The current applied to the gold sputtering target (54 mm diameter) was 80 mA. The pressure was $6 \times 10^{-3}$ mbar during injection of argon gas. The diamond substrate/DLC layer was maintained at room temperature and gold deposition was carried out for 60 seconds. A gold layer of 25 nm thickness was obtained. The thickness of the gold layer was measured using an Optical Profiler WYKO NT9100 from Veeco.

EXAMPLE 4

A diamond substrate/DLC layer/platinum layer was prepared as described in Example 2.

A gold layer was deposited on the platinum layer by DC magnetron argon ion beam sputtering of a gold sputtering target. The current applied to the gold sputtering target (54 mm diameter) was 80 mA. The pressure was $6 \times 10^{-3}$ mbar during injection of argon gas. The diamond substrate/DLC layer/platinum layer was maintained at room temperature and gold deposition was carried out for 60 seconds. A gold layer of 25 nm thickness was obtained. The thickness of the gold layer was measured using an Optical Profiler WYKO NT9100 from Veeco.

EXAMPLE 5

A radiation detector was prepared using the diamond substrate having a DLC/Pt/Au contact of Example 4.

Figure 3:
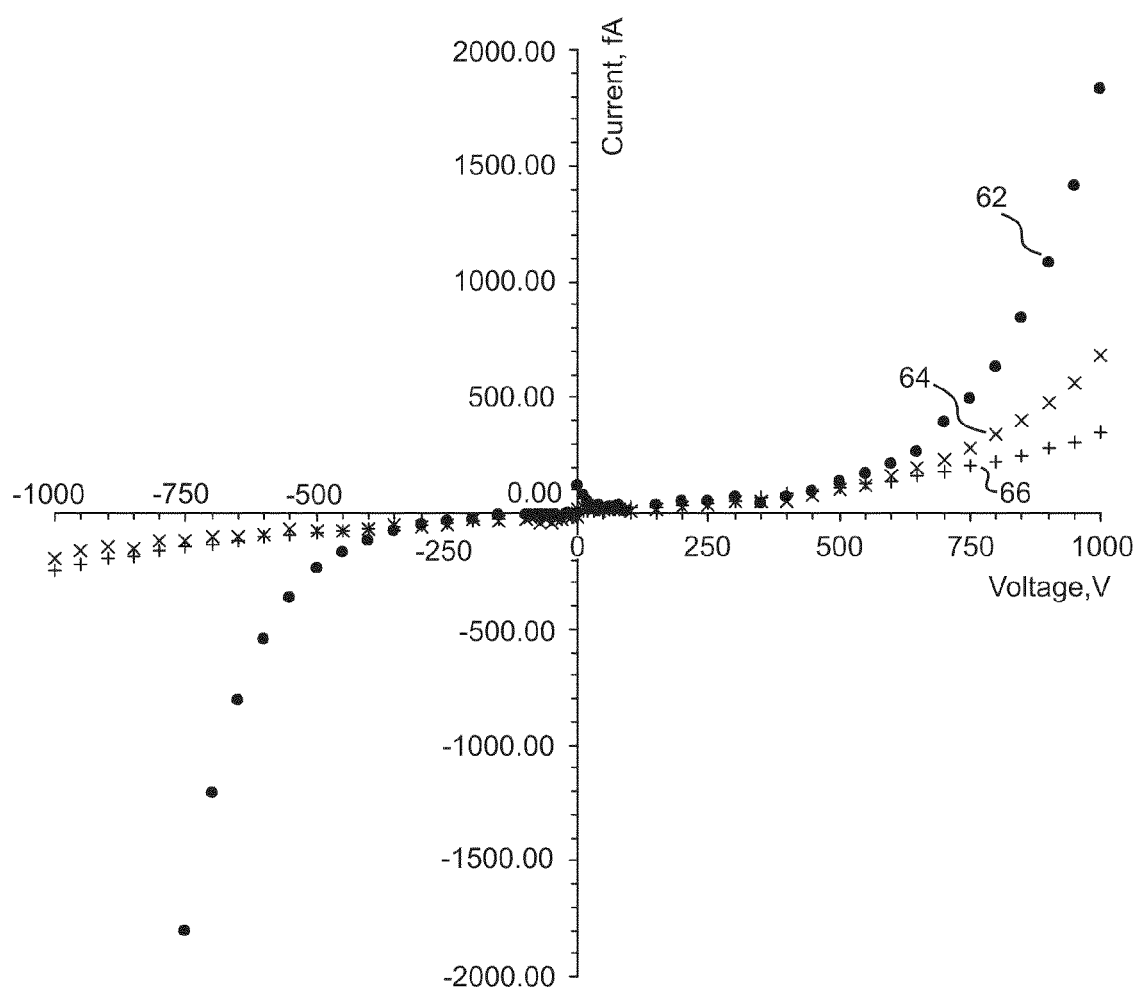
FIG. 3 shows a comparison of a current-voltage (I-V) curve of a diamond substrate having a contact according to the present invention with a diamond substrate having prior art contacts.

The current-voltage characteristics of the contact were tested and compared to the I-V characteristics of TiW and Cr/Au contacts on diamond substrates, as shown in FIG. 3. The Ti/W and Cr/Au contacts were prepared as described in Wedenig et al., Nuclear Physics B (Proc. Suppl.), 78 (1999), 497-504. In contrast to the I-V characteristics of the TiW (62) and Cr/Au (64) contacts, the diamond substrate having a DLC/Pt/Au contact (66) is linear and symmetrical. Therefore, the DLC/Pt/Au contact functions as a good ohmic contact.

The DLC/Pt/Au contact had a charge collection efficiency of 100% at an applied electric field of 0.377 V/μm under Sr-90 irradiation at a corresponding dark current value of less than 1 pA. By reference to FIG. 14, it can be seen that this charge collection efficiency for the DLC/Pt/Au contact (84) is at least as good as that obtained when using the conventional Ti/W (80) and Cr/Au (82) contacts.

EXAMPLE 6

Figure 4B:
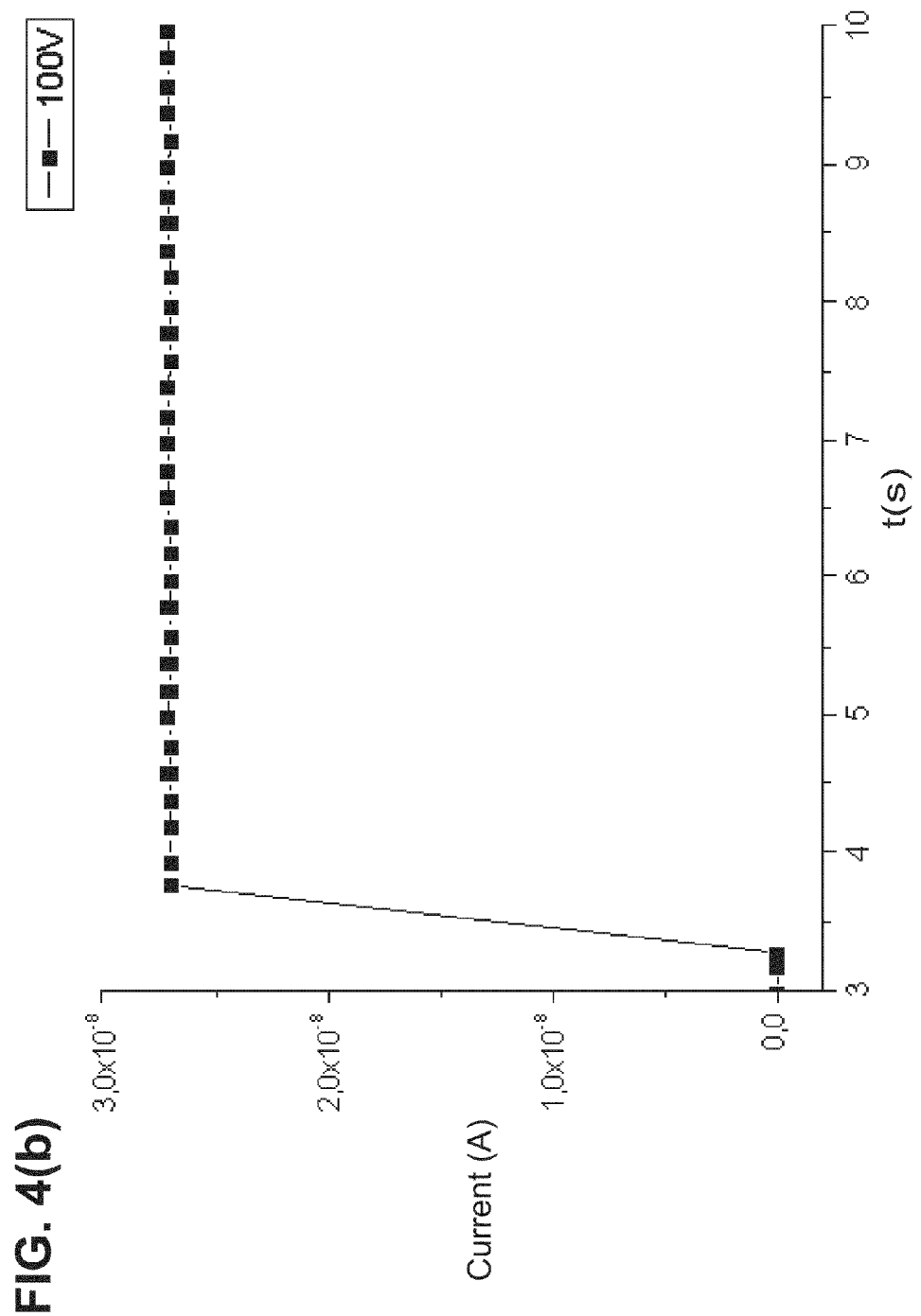

The diamond substrate having a DLC/Pt/Au contact prepared in Example 4 was exposed to Co-60 gamma rays for 5 minutes while a positive bias of 100 V was applied. Co-60 gamma rays are typical of the radiation used in radiotherapy. A graph of the current variation of the diamond substrate/DLC/Pt/Au contact with time is shown in FIG. 4(*a*). The diamond substrate/DLC/Pt/Au contact shows a very fast response when the Co-60 gamma ray source was switched on and also a very fast response when the source was switched off. This is indicative of the absence of a memory or pumping effect. The signal was stable as there was a very low fluctuation of the signal (less than 0.5%). The signal to noise ratio was very high (about $3.3 \times 10^4$).

This is in comparison to the signal to noise ratio of 776 which has been reported for single crystal diamond having a nickel contact on one side thereof and an ohmic gold contact on the opposite side thereof as described in Tranchant et al., Diamond & Related Materials, 17 (2008), 1297-1301.

The response velocity of the diamond substrate/DLC/Pt/Au contact was also examined by recording the value of the current every 0.2 seconds, as shown in FIG. 4(*b*). This result shows that when the Co-60 gamma ray source was switched on, the diamond substrate/DLC/Pt/Au contact reached a stable current level within 0.2 seconds.

Under the same operating conditions, the reproducibility of the signal was examined by repeatedly switching on and off the Co-60 gamma ray source. The Co-60 gamma ray source was switched on for 60 seconds and then switched off for 10 seconds before being switched on again. The current-time graph is shown in FIG. 5(*a*) and shows that the signal was highly reproducible and a variation of less than 0.5% was found. The current detected responded quickly to the switching on and off of the Co-60 gamma ray source.

The dose dependence of the collected charge gave a slope equal to 0.51 μC/Gy for 2 V bias applied and shows charge linearity, see FIG. 5(*b*). This is in comparison to the value of 0.085 μC/Gy for the polycrystalline and single crystal diamond detectors reported in Descamps et al, Radiation Measurements, 43 (2009), 933-938.

The dose rate linearity response was investigated at a bias of 100 V and shown to be highly linear, see FIG. 5(*c*).

The DLC/Pt/Au layer was found to be durable and did not delaminate from the diamond substrate under repeated testing.

EXAMPLE 7

A single crystal CVD diamond substrate having a thickness of 500 μm was provided with DLC/Pt/Au contacts as described in Example 4 in order to provide a single crystal diamond radiation detector. The thicknesses of the three layers of the contact were as follows: DLC 3 nm; Pt 16 nm; and Au 200 nm.

The diamond substrate having the DLC/Pt/Au contacts was exposed to 5.5 MeV alpha particle irradiation in a vacuum chamber. A standard Am-241 (5.5 MeV) alpha source was used. The diamond substrate having the DLC/Pt/Au contacts was placed at 30° off axis. The detector output was arranged to feed a pre-amplifier having a bandwidth of 300 MHz and a rise/fall time of less than 5 ns. The signal was digitalized by an oscilloscope (Tektronik DPO-7054). The pressure in the vacuum chamber was maintained at $4 \times 10^{-6}$ mbar. Bias voltages of 150 V, 250 V, 350 V, 450 V and 550 V were applied and 2000 pulses were recorded per applied bias voltage. The amplitude distribution was obtained using ROOT software. The resolution of the detector may be calculated as the ratio between the FWHM and the peak centroid (i.e. maximum amplitude) $H_0$ of the signal.

Where FWHM is the full width at half maximum, and $H_0$ centroid is the average pulse amplitude of the distribution. The resolution obtained at the bias voltages is shown in Table 1. Spectroscopic resolution of less than 3% was obtained.

TABLE 1

| Bias voltage (V) | FWHM (V) | $H_0$ (V) | Resolution (%) |
|---|---|---|---|
| 150 | 0.001179 | 0.04033 | 2.92 |
| 250 | 0.001552 | 0.05131 | 3.02 |
| 350 | 0.001451 | 0.05744 | 2.52 |
| 450 | 0.001413 | 0.06098 | 2.31 |
| 550 | 0.001375 | 0.06332 | 2.17 |

FIG. 6 shows the spectroscopic response of the device under Am-241 alpha particle irradiation.

EXAMPLE 8

A high purity single crystal CVD diamond substrate having a thickness of 550 μm was prepared and onto this substrate was deposited a layer of gold by thermal evaporation. The thickness of the gold layer was 50 nm. The diamond substrate was irradiated with Co-60 gamma rays (0.93 Gy/min dose rate) and the current was measured with time at an applied electric field of 0.18 V/μm.

The gold contact was removed from the diamond sample and then a DLC/Pt/Au contact according to the present invention was prepared. The diamond substrate was again irradiated with Co-60 gamma rays (0.93 Gy/min dose rate) and the current was measured with time at an applied electric field of 0.18 V/μm.

A current-time graph of the response to Co-60 irradiation of the DLC/Pt/Au (68) and Au only (70) contacts is shown in FIG. 7.

In both cases, the measured dark current was $2.2 \times 10^{-13}$ A. The measured current under irradiation for the DLC/Pt/Au contact was $1.15 \times 10^{-7}$ A, with a signal to noise ratio (S/N) of $5.2 \times 10^5$. The measured current under irradiation for the Au only contact was $3.5 \times 10^{-8}$ A, with a signal to noise ratio (S/N) of $1.6 \times 10^5$.

The DLC/Pt/Au contact shows a gain of over 3 times as much in the measured current compared to the Au contact. The DLC/Pt/Au contact also showed less fluctuation in the signal (0.32%) compared to the Au contact (0.72%). The DLC/Pt/Au contact was also evidently more durable than the Au contact.

EXAMPLE 9

A high purity single crystal CVD diamond substrate was prepared having dimensions 4×4×0.42 mm. The surfaces of the diamond substrate were polished to a surface roughness $R_a$ of about 5 nm (measured using a stylus profilometer according to British Standard BS 1134 Part 1 and Part 2).

The diamond substrate was cleaned in a boiling solution of concentrated sulphuric acid and potassium nitrate, washed several times in deionized water and then immersed in an ultrasonic bath of water for about 10 minutes.

A gold layer was then deposited on one face of the substrate by sputtering. The gold sputtering target was biased to 80 mA. The pressure was $9 \times 10^{-5}$ mbar before the injection of argon gas. Gold deposition was carried out for 8 minutes to provide a layer having a thickness of about 200 nm. FIG. 8 shows the optical interferometry image of the as-deposited gold layer. The homogeneity of the as-deposited gold layer is clear from this figure.

A DLC/Pt/Au layer was deposited on the opposite face of the substrate as described in Example 4. The thicknesses of the three layers of the contact were as follows: DLC 3 nm; Pt 16 nm; and Au 200 nm. FIG. 9 shows the optical interferometry image of the as-deposited DLC/Pt/Au contact. Again, ignoring the dust which can be seen in the image, the homogeneity of the as-deposited contact is clear.

The coated diamond substrate was then immersed in water and subjected to ultrasonication for 5 minutes at a temperature of about 25° C. at a frequency of about 35 kHz and a power of about 120 W using an AOYUE 9080 cleaning tank.

With reference to FIG. 10, it is possible to see clearly the disc-shaped contact to which the gold layer is still adhered. FIG. 11 is an optical interferometry image of the DLC/PT/Au sputtered face after the ultrasonication step. The black parts (72) of the image are the areas of the surface where the contact is no longer adhered to the surface of the diamond substrate. By reference to this figure, it is clear that more than 95% of the surface area of the diamond substrate is still adhered to the DLC/Pt/Au contact.

In contrast by reference to FIG. 12, there is no trace of the Au contact adhered to the opposite surface of the diamond substrate. The gold flakes (74) which have delaminated can be seen in the images (and by the naked eye) in the ultrasonic water bath. The blurred disc shaped image (76) which can be seen is the DLC/Pt/Au contact deposited on the other surface of the diamond substrate.

The loss of the entirety of the gold contact was confirmed by the optical interferometry image illustrated in FIG. 13. In this image, it is clear that the Au contact has been completed removed, with the black spots (78) indicating only residue of Au.

On the basis of these results, it is clear that the DLC/Pt/Au contacts of the present invention exhibit significantly improved adhesion to a diamond substrate as compared to Au contacts.

EXAMPLE 10

A DLC/Pt/Au contact was formed on a single crystal CVD diamond plate having a thickness of approximately 200 μm according to the method described in Example 1. The resulting diamond and contact was used as the electron emitter element in a larger system, such as that described in J. Smedley et al, 'Electron Amplification in Diamond' (in 'Advanced Accelerator Concepts: 12th Advanced Accelerator Concepts Workshop', AIP Conference Proceedings, 877 (2006), 672-679). The DLC/Pt/Au contact was used in place of the contact comprising a thin metal layer shown in FIG. 1 of the above referenced publication. The gain in signal obtainable from the device using the DLC/Pt/Au contact of the invention was approximately twice that obtained in an otherwise similar device with either a Ti/W or a Ti/Pt contact.

EXAMPLE 11

A contact was formed on a single crystal CVD diamond plate by exposing the surface of the diamond plate to low energy (approximately 500 eV) Pt ions in a sputtering machine. The Pt ions incident at the surface are implanted a small distance into the surface (a process known in the art as "sub-plantation"). During the sputtering process, the structure of the near surface region of the diamond is disrupted and a thin layer of DLC with interspersed Pt atoms is formed. The thickness of the disrupted layer was estimated to be a few nm based on the penetration depth of 500 eV Pt ions. A Pt layer and an Au layer were then deposited on the DLC layer as described in Example 4. The resulting contact remained attached to the diamond plate during subjecting the contact to ultrasonication for 5 minutes at a temperature of about 25° C. at a frequency of about 35 kHz and a power of about 120 W using an AOYUE 9080 cleaning tank. Tests of the ohmicity of the contact indicate a linear I-V response.

The invention claimed is:

1. A diamond substrate having a contact, wherein the contact comprises:
   (a) a diamond-like-carbon (DLC) layer on at least part of a surface of the diamond substrate, the DLC layer having a thickness of from about 0.1 nm to about 10 nm; and
   (b) at least one metal layer on at least part of the surface of the DLC layer.

2. The diamond substrate of claim 1, wherein the DLC layer is able to act as a quantum mechanical tunnelling junction.

3. The diamond substrate of claim 1, wherein the DLC layer has a thickness of from about 1 nm to about 3 nm.

4. The diamond substrate of claim 1, wherein the at least one metal layer comprises a noble metal.

5. The diamond substrate of claim 1, wherein the contact is an ohmic contact.

6. The diamond substrate of claim 5, wherein the at least one metal layer has a work function higher than the work function of the diamond substrate.

7. The diamond substrate of claim 5, wherein the metal layer comprises a metal selected from platinum and gold.

8. The diamond substrate of claim 1, comprising two metal layers on the DLC layer.

9. The diamond substrate of claim 8, wherein a platinum layer is formed over the DLC layer and a gold layer is formed over the platinum layer.

10. The diamond substrate of claim 1, wherein the diamond substrate is single crystal diamond.

11. The diamond substrate of claim 1, wherein the diamond substrate is CVD diamond.

12. A device comprising a diamond substrate as defined in claim 1.

13. The device of claim 12, wherein the device is a radiation detector.

* * * * *